United States Patent
Lin et al.

(10) Patent No.: US 11,152,473 B2
(45) Date of Patent: Oct. 19, 2021

(54) DEVICE WITH DOPED PHOSPHORENE AND METHOD FOR DOPING PHOSPHORENE

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Yu-Ming Lin, Hsinchu (TW); Chao-Hsin Wu, Taipei (TW); Hsun-Ming Chang, Kaohsiung (TW); Samuel C. Pan, Hsinchu (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/875,869

(22) Filed: May 15, 2020

(65) Prior Publication Data

US 2020/0279924 A1   Sep. 3, 2020

Related U.S. Application Data

(62) Division of application No. 15/959,411, filed on Apr. 23, 2018, now Pat. No. 10,658,470.
(Continued)

(51) Int. Cl.
*H01L 29/66* (2006.01)
*H01L 29/24* (2006.01)
(Continued)

(52) U.S. Cl.
CPC ............ *H01L 29/24* (2013.01); *H01L 21/385* (2013.01); *H01L 29/0649* (2013.01); *H01L 29/1033* (2013.01); *H01L 29/267* (2013.01); *H01L 29/401* (2013.01); *H01L 29/45* (2013.01); *H01L 29/66969* (2013.01); *H01L 29/778* (2013.01); *H01L 29/7786* (2013.01); *H01L 29/786* (2013.01); *H01L 29/78696* (2013.01); *H01L 29/861* (2013.01); *H01L 21/47573* (2013.01); *H01L 29/66545* (2013.01); *H01L 29/66742* (2013.01)

(58) Field of Classification Search
CPC ..... H01L 29/24; H01L 29/778; H01L 29/861; H01L 29/45; H01L 29/78696; H01L 29/7786; H01L 29/267; H01L 29/66969; H01L 29/786; H01L 29/0649; H01L 29/401; H01L 21/385; H01L 29/1033; H01L 29/66545; H01L 21/47573; H01L 29/66742
USPC ........................................................ 257/288
See application file for complete search history.

(56) References Cited

U.S. PATENT DOCUMENTS 9,608,069 B1 * 3/2017 Basker .............. H01L 29/66795
9,620,627 B1 * 4/2017 Yeo ..................... H01L 27/1203
(Continued)

*Primary Examiner* — Caleb E Henry
(74) *Attorney, Agent, or Firm* — Maschoff Brennan

(57) ABSTRACT

A device includes a phosphide-containing structure, a dopant source layer and a conductive contact. The phosphide-containing structure has a first chemical element in a compound with phosphorus. The dopant source layer is over the phosphide-containing structure and has a second chemical element the same as the first chemical element. The conductive contact is over the dopant source layer.

20 Claims, 12 Drawing Sheets

Related U.S. Application Data

(60) Provisional application No. 62/586,097, filed on Nov. 14, 2017.

(51) Int. Cl.

| | | |
|---|---|---|
| *H01L 29/786* | (2006.01) | |
| *H01L 29/06* | (2006.01) | |
| *H01L 29/40* | (2006.01) | |
| *H01L 21/385* | (2006.01) | |
| *H01L 29/10* | (2006.01) | |
| *H01L 29/778* | (2006.01) | |
| *H01L 29/861* | (2006.01) | |
| *H01L 29/45* | (2006.01) | |
| *H01L 29/267* | (2006.01) | |
| *H01L 21/4757* | (2006.01) | |

(56) References Cited

U.S. PATENT DOCUMENTS

| | | | | |
|---|---|---|---|---|
| 10,217,513 | B2* | 2/2019 | Lee | H01L 45/065 |
| 10,283,590 | B2* | 5/2019 | Yeh | H01L 29/1033 |
| 10,418,490 | B2* | 9/2019 | Xie | H01L 29/786 |
| 10,665,721 | B1* | 5/2020 | Liu | H01L 29/66969 |
| 10,833,199 | B2* | 11/2020 | Clifton | H01L 29/0847 |
| 2015/0170906 | A1* | 6/2015 | Redepenning | H01L 29/42364 257/29 |
| 2016/0056301 | A1* | 2/2016 | Lee | H01L 29/4234 365/185.29 |
| 2016/0190244 | A1* | 6/2016 | Lee | H01L 29/7839 257/29 |
| 2016/0372553 | A1* | 12/2016 | Xiao | H01L 29/775 |
| 2017/0162654 | A1* | 6/2017 | Maeda | H01L 29/78696 |
| 2017/0213854 | A1* | 7/2017 | Wang | H01L 21/77 |
| 2017/0244055 | A1* | 8/2017 | Bangsaruntip | H01L 21/02623 |
| 2017/0261465 | A1* | 9/2017 | Balijepalli, IV | B01L 3/502715 |
| 2017/0322166 | A1* | 11/2017 | Zhou | G01N 27/4141 |
| 2018/0012962 | A1* | 1/2018 | Yeh | H01L 29/66969 |
| 2018/0145184 | A1* | 5/2018 | Clifton | H01L 29/0847 |
| 2018/0182898 | A1* | 6/2018 | Moroz | H01L 29/0665 |
| 2018/0254335 | A1* | 9/2018 | Ilatikhameneh | H01L 29/42312 |
| 2018/0294156 | A1* | 10/2018 | Xia | H01L 21/6835 |
| 2018/0374962 | A1* | 12/2018 | Das | H01L 29/66969 |
| 2019/0013408 | A1* | 1/2019 | Xie | H01L 29/66969 |
| 2019/0051681 | A1* | 2/2019 | Kallioinen | H01L 27/14603 |
| 2019/0051786 | A1* | 2/2019 | White | H01L 31/035218 |
| 2019/0089123 | A1* | 3/2019 | Husko | H01S 5/30 |
| 2019/0139835 | A1* | 5/2019 | Yang | H01L 21/823807 |

* cited by examiner

DEVICE WITH DOPED PHOSPHORENE AND METHOD FOR DOPING PHOSPHORENE

PRIORITY CLAIM AND CROSS-REFERENCE

This application is a divisional application of U.S. patent application Ser. No. 15/959,411, filed Apr. 23, 2018, now U.S. Pat. No. 10,658,470, issued May 19, 2020, which claims priority to U.S. Provisional Application Ser. No. 62/586,097, filed Nov. 14, 2017, which are herein incorporated by reference in their entirety.

BACKGROUND

With the progress of transistor process technology, the dimension of transistors has shrunk and therefore the number of transistors per unit area of an integrated circuit has increased accordingly. However, the off-state current has dramatically increased with further reduction in the channel length of a transistor, i.e., short channel effect. This effect is the major challenge of further increasing the density of transistors. Reducing the thickness of channel is known as one way of suppressing short channel effect. Two-dimensional (2D) semiconductors are expected to serve as ultra-thin semiconductor channel materials to suppress the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
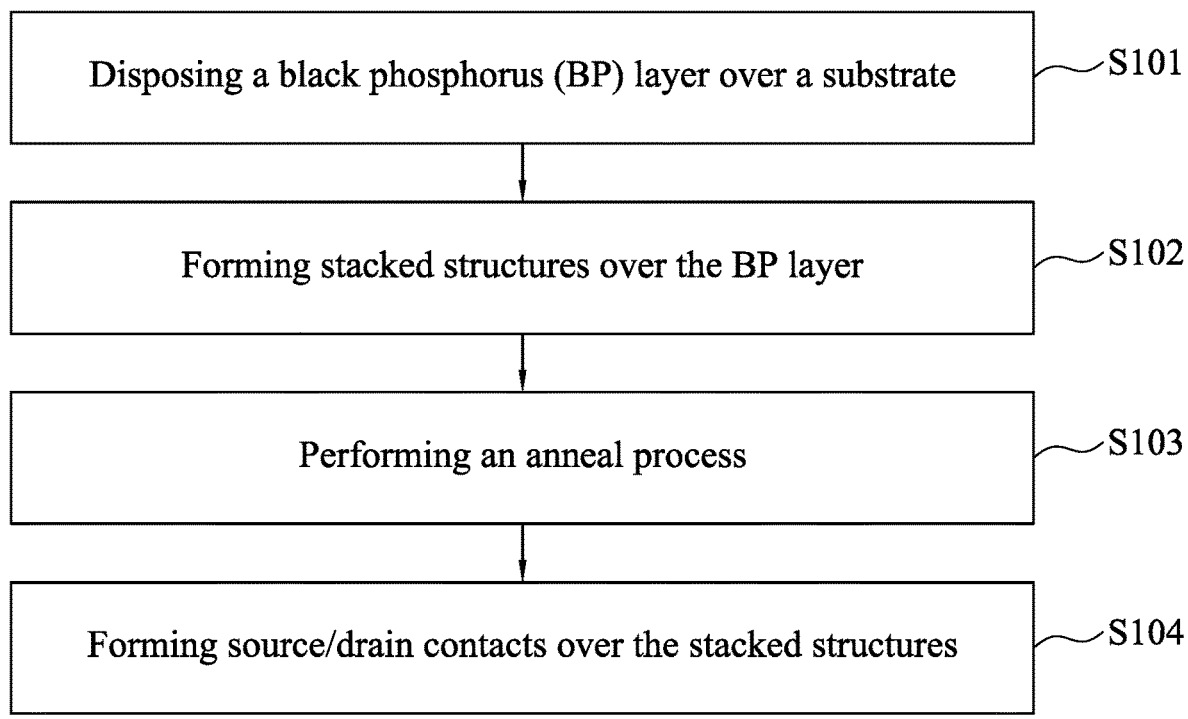
FIG. 1 is an exemplary process flow chart for fabrication of a semiconductor device such as a back-gated metal-oxide-semiconductor field-effect transistor (MOSFET), according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is an exemplary process flow chart for fabrication of a semiconductor device such as a back-gated metal-oxide-semiconductor field-effect transistor (MOSFET), according to one or more embodiments of the present disclosure. The flow chart illustrates a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

Figure 2A:
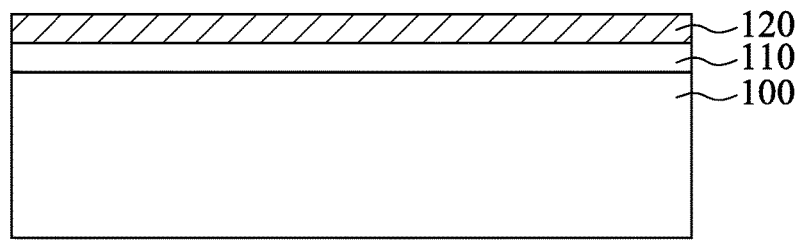
FIGS. 2A through 2D are exemplary cross-sectional views showing various processes for fabrication of a semiconductor device according to some embodiments of the present disclosure.

In S101 of FIG. 1, a black phosphorus (BP) layer 120 is provided on a dielectric layer 110 over a substrate 100, as shown in FIG. 2A. The substrate 100 can be a doped silicon substrate. For example, the substrate 100 is a p-type silicon substrate in some embodiments. In other embodiments, the substrate 100 is an n-type silicon substrate. The crystal orientation of Si substrate is (100) in some embodiments. The doped silicon substrate 100 can act as a back gate of a transistor in some embodiments.

Alternatively, the substrate 100 may comprise another elementary semiconductor, such as germanium, a compound semiconductor including Group IV-IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate 100 is a silicon layer of an SOI (silicon-on-insulator) substrate. The substrate 100 may include various regions that have been suitably doped with impurities (e.g., p-type or n-type conductivity).

In some embodiments, the BP layer 120 is subsequently formed into a channel and source/drain areas of a field effect transistor (FET). Black phosphorus is a two-dimensional (2D) material existing as stacks of strongly bonded layers with weak interlayer van der Waals attraction, allowing the layers to be mechanically or chemically exfoliated into individual, atomically thin layers. 2D materials, also referred to as single-layer or few-layer materials, are crystalline materials of a few layers of atoms.

For example, black phosphorus is a layered material and a monolayer of black phosphorus is termed phosphorene, and hence the BP layer 120 can also be referred to as a phosphorene-containing layer. One advantageous feature is that black phosphorus is a semiconductor with a direct band gap ranging from about 1.5 eV for a monolayer to about 0.59 eV for a five-layer stack at the Γ point of the first Brillouin zone. Another advantageous feature of black phosphorus is high carrier mobility. Because of these advantageous features, black phosphorus is a promising candidate for channel and source/drain materials of transistors.

In some embodiments, the BP layer 120 is exfoliated from bulk black phosphorus crystals using a physical method (mechanical exfoliation and tapping method). In some embodiments, the BP layer 120 is exfoliated from black phosphorus crystals using a chemical method (liquid exfoliation). In other embodiments, the BP layer 120 is formed over the dielectric layer 110 using suitable deposition techniques, such as atomic layer deposition (ALD), as described herein. The description of the deposition method is exemplary and is not intended to be limiting beyond what is specifically discussed. In some embodiments, orthorhombic black phosphorus can be grown by a chemical vapor transport reaction from red phosphorus and tin and/or tin-iodide as a mineralization additive. In some other embodiments, black phosphorus can be synthesized from white phosphorus under high pressure (e.g., about 13,000 kg/cm$^2$) at a temperature within a range of about 200-250 degrees Celsius. The thickness of the black phosphorus can be controlled by the deposition time. In some embodiments, the period of multiple layers (e.g., thickness of a monolayer) of phosphorene is about 0.53 nm. In some embodiments, the thickness may range from 1 monolayer to 20 monolayers (e.g., about 10.6 nm in thickness). The thickness in some embodiments may be varied between different regions (e.g., channel region and source/drain regions). In some embodiments, the thickness variation of an active region can be continuous. In other embodiments, the thickness is between approximately 1 monolayer and 10 monolayers (e.g., about 5.3 nm in thickness).

In some embodiments, the dielectric layer 110 acts as a gate dielectric layer between the back gate 100 and the BP layer 120. In some embodiments, the dielectric layer 110 is, for example, silicon oxide or a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 110 may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide (Ta$_2$O$_5$), yttrium oxide (Y$_2$O$_3$), strontium titanium oxide (SrTiO$_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), the like, and combinations thereof. In alternative embodiments, the dielectric layer 110 may have a multilayer structure such as one layer of silicon oxide (e.g., interfacial layer) and another layer of high-k material. The dielectric layer 110 may be formed over the substrate 100 using, for example, molecular-beam deposition (MBD), atomic layer deposition (ALD), physical vapor deposition (PVD), chemical vapor deposition (CVD), or the like.

Figure 2B:
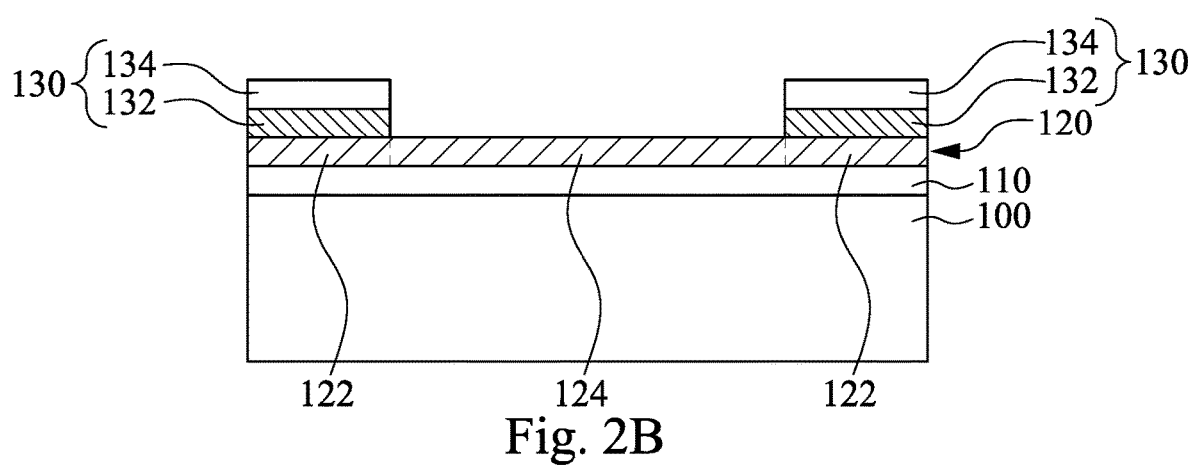

In S102 of FIG. 1, stacked structures 130 are formed over the BP layer 120, as shown in FIG. 2B. The stacked structures 130 include dopant source layers 132 and cap metal layers 134 stacked over the respective dopant source layers 132. In one or more implementations, example materials that can be used for the dopant source layers 132 include elements of Group III (e.g. B, Al, Ga, In), elements of Group IV (C, Si, Ge, Sn, Pb), elements of VI (S, Se, Te), or the like. Elements of Group III and IV act as p-type dopants for the BP layer 120 because phosphorus is an element of Group V. On the other hand, elements of Group VI act as n-type dopants. In some embodiments, example materials that can be used for the cap metal layers 134 include noble metals such as Au, Ag, Pd, Pt, Ru, Rh, the like or combinations thereof. In some implementations, formation of the stacked structures 130 includes forming a blanket dopant source layer over the BP layer 120 and a blanket cap metal layer over the blanket dopant source layer, and then patterning these layers to form separate stacked structures 130 arranged on the BP layer 120 in a spaced-apart manner. Regions of the BP layer 120 covered by the dopant source layers 132 can act as source/drain regions 122, and a region of the BP layer 120 not covered by the dopant source layer 132 can act as a channel region 124. As illustrated, the dopant source layers 132 are over respective source/drain regions 122 and not over the channel region 124. Formation of the blanket dopant source layer and cap metal layer can be, for example, ALD, CVD, PVD, or other suitable deposition techniques. Patterning the deposited layers may use, for example, e-beam lithography, photolithography or the like. An alignment kay can be optionally formed on the substrate 100 for facilitating the patterning process in some embodiments. In some exemplary embodiments, the atomic percentage of the desirable dopant in dopant source layers 132 may be greater than about 90 percent, and may actually be a pure dopant layer. In the illustrated embodiments, the dopant source layer 132 is germanium, and the cap metal layer 134 is gold.

In S103 of FIG. 1, an anneal process 140 is carried out to drive dopants from the dopant source layers 132 to diffuse into the underlying source/drain regions 122 of the BP layer 120 to form phosphide-containing source/drain regions 122', which can be equivalently referred to as phosphide-containing structures. Moreover, dopant source layers 132' after the anneal process 140 have lower dopant concentration than the dopant source layers 132. In some embodiments where the dopant source layers 132 are germanium, with elevated anneal temperature, the germanium atoms diffuse from the dopant source layers 132 into the underlying source/drain regions 122 of the BP layer 120 and react with the BP layer 120. This reaction results in formation of germanium-phosphide (PGe$_x$) binary compound in the source/drain regions 122'. In this case, germanium atoms may replace some phosphorus atoms in a crystal lattice structure of the BP layer 120 (e.g. a honeycomb lattice structure). Therefore, germanium atoms can be incorporated into the honeycomb lattice structure substitutionally to form the germanium-phosphide compound in the source/drain regions 122', and hence the source/drain regions 122' can also be referred to as substitutionally doped BP regions 122'. Further, the resulting dopant source layers 132' have lower germanium concentration (i.e. germanium atomic percentage) than the dopant source layer layers 132 because some germanium atoms are incorporated into the subsututionally doped BP regions 122'.

Figure 3:
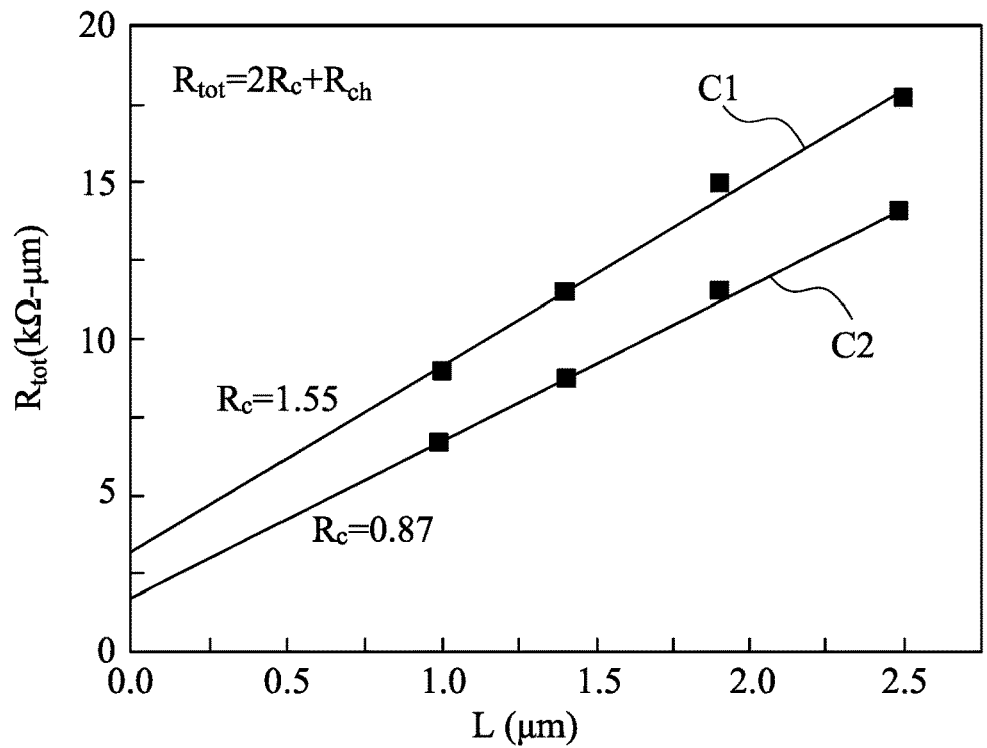
FIG. 3 illustrates experimental results of total resistances of transistors with phosphide-containing source/drain regions in different condition in some embodiments of the present disclosure.

The anneal process 140 allows the source/drain regions 122' to become metallic as demonstrated in FIG. 3, which illustrates experimental results of total resistances of transistors with germanium-phosphide-containing source/drain regions in different conditions, wherein total resistance ($R_{tot}$) is shown on the vertical axis and the channel length (L) is shown on the horizontal axis. In Condition C1, the total resistance is measured at a temperature about 300K, and in Condition C2, the total resistance is measured at a temperature about 80K. As shown in FIG. 3, the total resistance of a transistor with germanium-phosphide-containing source/drain regions decreases as temperature decreases. The total resistance reflects the contact resistance ($R_c$) and the channel resistance ($R_{ch}$). Because the BP channel is semiconductor, the channel resistance increases as temperature decreases. Therefore, decreasing of the total resistance as temperature decreases means that the contact resistance attributed to the germanium-phosphide-containing source/drain region decreases as temperature decreases. This experimental results show that the resistance of germanium-phosphide decreases as temperature decreases, which is a metallic behavior opposite to a semiconductive behavior, and hence germanium-phosphide is metallic rather than semiconductive. As a result, the source/drain regions 122 of the BP layer 120 are metallized by the anneal process 140.

Process conditions of the anneal process 140 is controlled such that a majority of the channel region 124 is not intentionally doped or reacted with germanium and is thus not metallized. In this case, phosphorus in the channel region 124 is not transformed into phosphide and thus remains intrinsic black phosphorus, which demonstrates semiconductive behavior. Therefore, the doped source/drain regions 122' are more metallic than the BP channel region 124. Such a combination of the metallized BP regions 122' and the intrinsically semiconductive BP region 124 in the BP layer 120 is advantageous for reduction of source/drain contact resistance, as demonstrated in FIG. 4, which will be discussed in a greater detail below. Since the source/drain regions 122' is metallized and the BP channel region 124 remains semiconductive, a band gap of metallized source/drain region 122' may be less than a band gap of the channel region 124 in some embodiments. A band bap difference between the metallized BP and the intrinsic BP may be in a range from about 0.1 eV to about 1.5 eV. In some embodiments, the channel region 124 not intentionally doped can be equivalently referred to a phosphorene-containing structure.

Moreover, if the source/drain regions 122 do not react with chemical elements in the overlying layers 132 and remain intrinsic black phosphorus, the resulting interface between the intrinsic black phosphorus and the overlying layer 132 has a Van Der Waals gap or tunnel barrier. The Van Der Waals gap results in reduced efficiency in carrier injection from subsequently formed source/drain contacts into the source/drain regions 122. Accordingly, the source/drain contact resistance would be high if the anneal process 140 is omitted. On the contrary, because the anneal process 140 allows chemical elements in the dopant source layer 132 to react with the underlying source/drain region 122, the Van Der Waals gap or tunnel barrier between the dopant source layer 132 and the source/drain region 122 can be eliminated. As a result, the anneal process 140 is advantageous for reduction of source/drain contact resistance, as demonstrated in FIG. 4, which is discussed further below.

Figure 4:
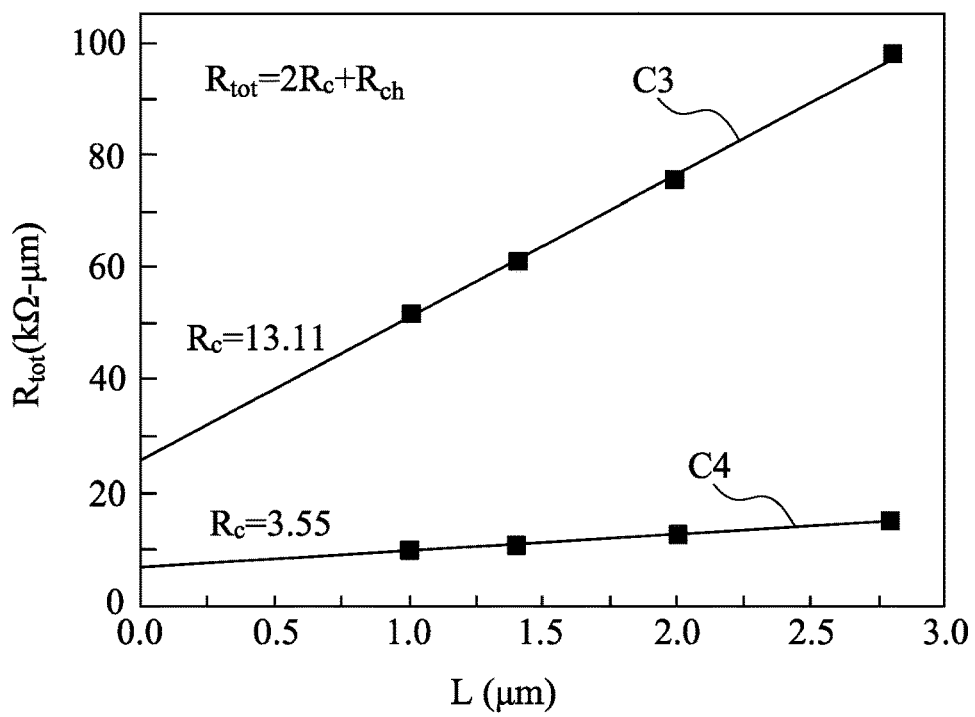
FIG. 4 illustrates experimental results of total resistances of transistors with BP layer in different conditions.

FIG. 4 illustrates experimental results of total resistances of transistors with BP layer in different conditions, wherein total resistance is shown on the vertical axis and the channel length is shown on the horizontal axis. In Condition C3, stacked structures, having a germanium layer capped with a gold layer, are formed over source/drain regions of the BP layer, and no anneal process is performed to drive germanium into the BP layer. In Condition C4, an anneal process is performed to drive germanium into the BP layer and to react germanium with black phosphorus. As shown in FIG. 4, when the anneal process is performed to drive germanium into the BP layer and to react germanium with black phosphorus, the total resistance is considerably reduced. Moreover, it is calculated from the experimental results that the source/drain contact resistance with the anneal process becomes about 1/3.7 or less than that in the Condition 3 without the anneal process.

In some embodiments, the anneal process is a rapid thermal anneal (RTA) process, or other suitable anneal process. In some embodiments, the RTA process is performed at a temperature in a range between about 200 degrees Celsius to about 300 degrees Celsius with a duration that lasts for about 5 seconds to 120 seconds in a nitrogen environment. For example, in the RTA process, the device as illustrated in FIG. 2B can be loaded in to an $N_2$ chamber and then heated to about 250 degrees Celsius in about 13 seconds, and the temperature is kept at about 250 degrees Celsius for about 60 seconds. The above-mentioned process conditions is beneficial in creating germanium-phosphide in the source/drain regions 122' under the stacked structures 130 while leaving intrinsic black phosphorus in the channel region 124.

Figure 2C:
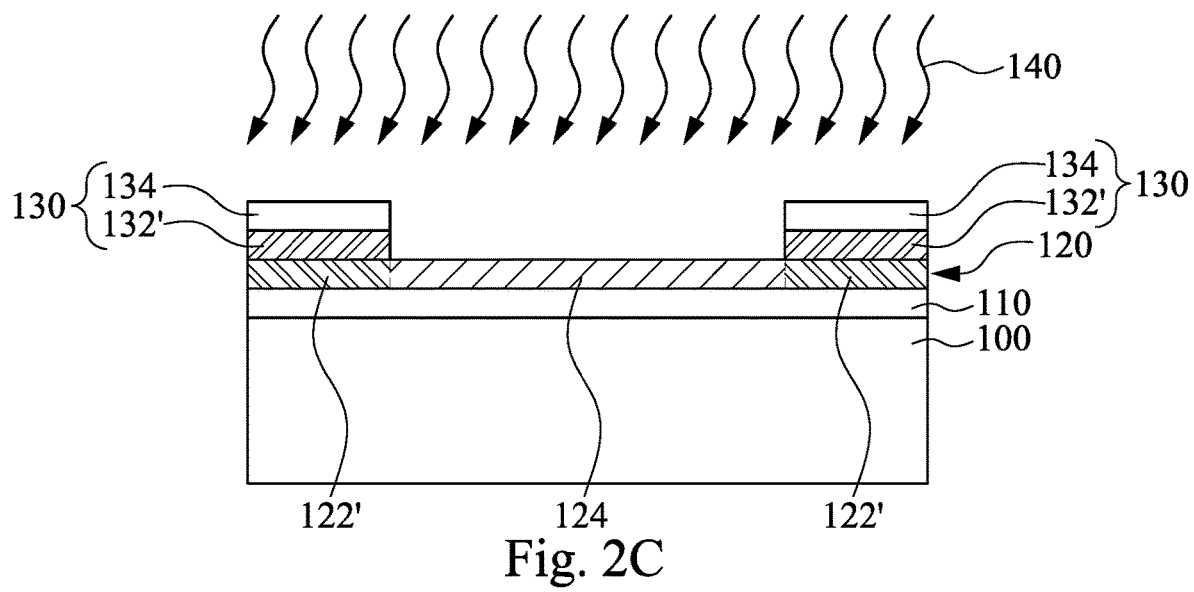
Figure 2D:
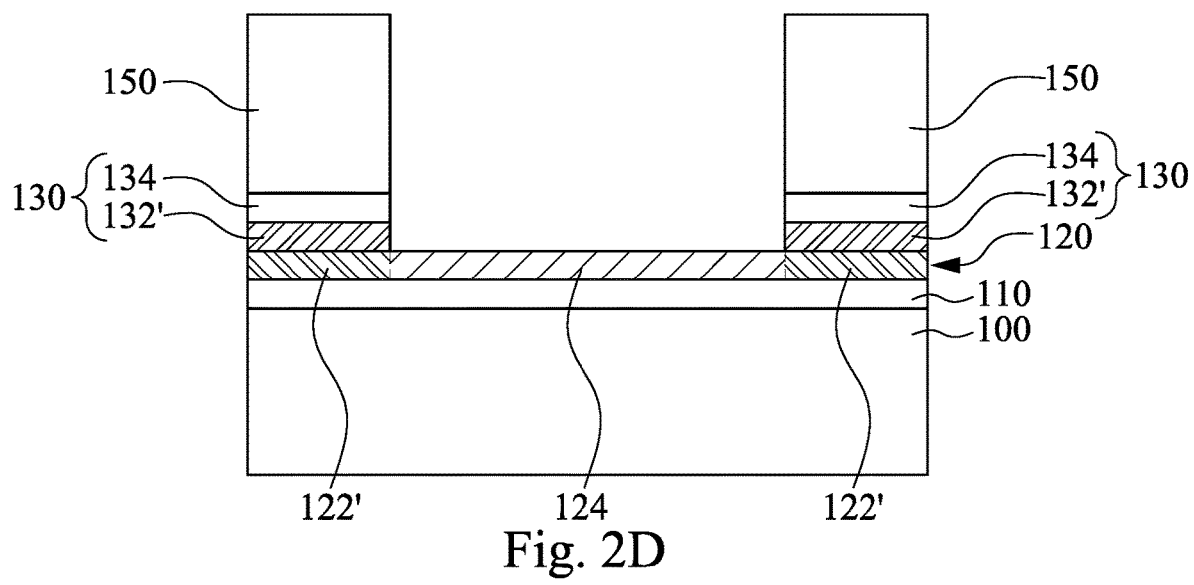

In S104 of FIG. 1, conductive source/drain contacts 150 are formed over respective stacked structures 130, as shown in FIG. 2D. In one or more implementations, example materials that can be used for the source/drain contacts 150 include metals such as Al, Cu, W, Ti, Ta, TiN, TiAl, TiAlN, TaN, NiSi, CoSi, other conductive materials, or combinations thereof. In some implementations, the source/drain contacts 150 can be deposited using, for example, ALD, CVD, PVD, or other suitable deposition techniques. As illustrated in FIG. 2D, the source/drain contacts 150 are in contact with respective cap metal layers 134 rather than intrinsic black phosphorus. As a result, the source/drain contact resistance can be reduced.

Figure 5:
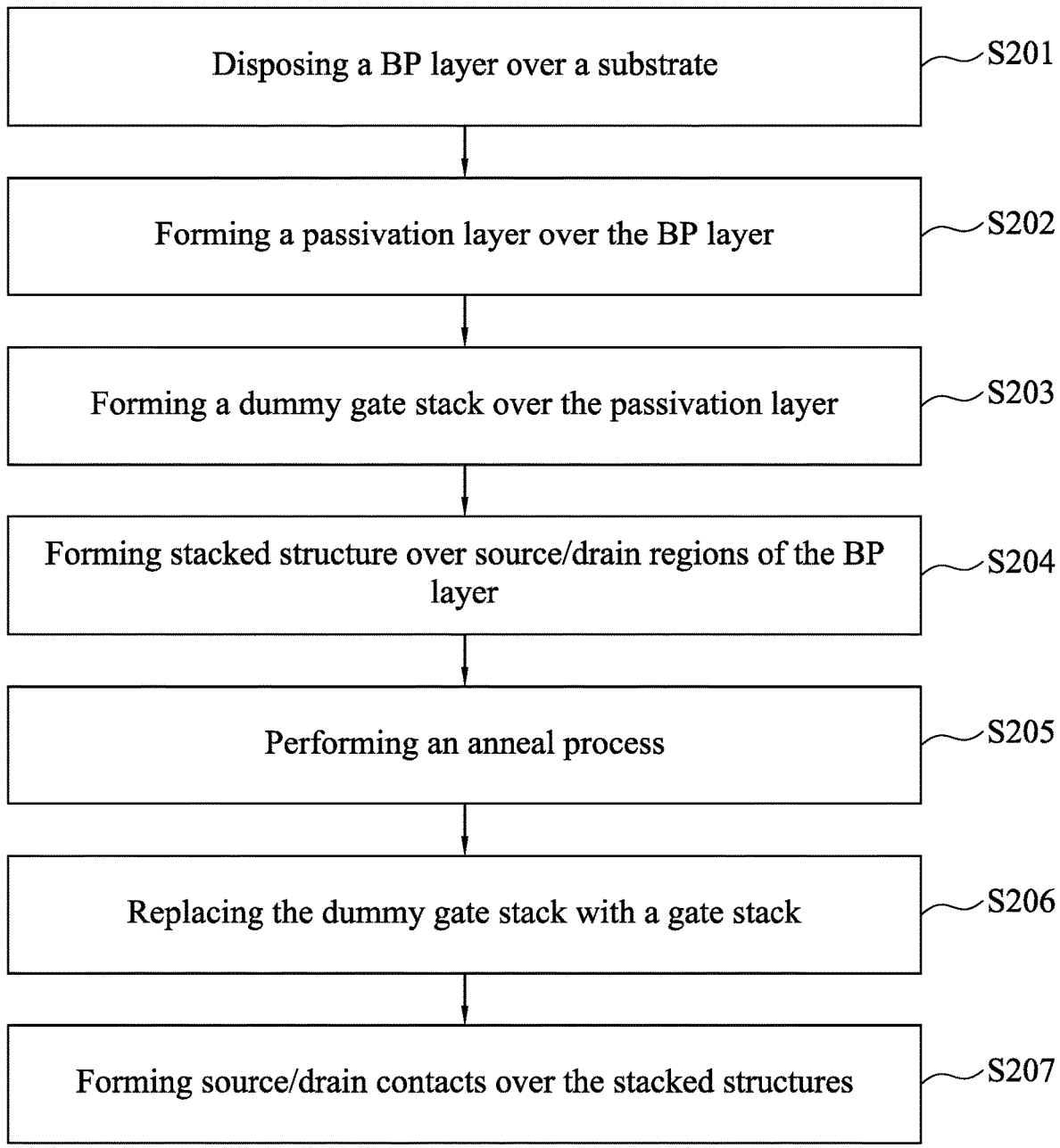
FIG. 5 is an exemplary process flow chart for fabrication of a semiconductor device such as a top-gated MOSFET, according to some embodiments of the present disclosure.

FIG. 5 is an exemplary process flow chart for fabrication of semiconductor device such as a top-gated MOSFET, according to one or more embodiments of the present disclosure. The flow chart illustrates a relevant part of the entire manufacturing process. It is understood that additional operations may be provided before, during, and after the operations shown by FIG. 5, and some of the operations described below can be replaced or eliminated for additional embodiments of the method. The order of the operations/processes may be interchangeable.

Figure 6A:
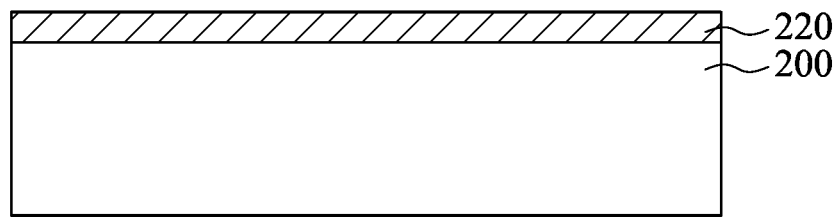
FIGS. 6A through 6G are exemplary cross-sectional views showing various processes for fabrication of a semiconductor device according to some embodiments of the present disclosure.

In S201 of FIG. 5, a BP layer 220 is disposed over a substrate 200, as shown in FIG. 6A. The substrate 200 can be, for example, a p-type or n-type silicon substrate. The crystal orientation of Si substrate is (100) in some embodiments. Alternatively, the substrate 200 may comprise another elementary semiconductor, such as germanium, a compound semiconductor including Group IV-IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate 200 is a silicon layer of an SOI (silicon-on-insulator) substrate. Amorphous substrates, such as amorphous Si or amorphous SiC, or insulating material, such as silicon oxide, may also be used as the substrate. The substrate 200 may include various regions that have been suitably doped with impurities (e.g., p-type or n-type conductivity).

In some embodiments, the BP layer 220 is subsequently formed into a channel, and source/drain areas of a transistor. In some embodiments, the BP layer 220 is exfoliated from bulk black phosphorus crystals using a physical method (mechanical exfoliation and tapping method). In some embodiments, the BP layer 220 is exfoliated from black phosphorus crystals using a chemical method (liquid exfoliation). In some other embodiments, the BP layer 220 is formed over the substrate 200 using suitable deposition techniques, such as atomic layer deposition (ALD), as described previously with regard to FIG. 2A.

Figure 6B:
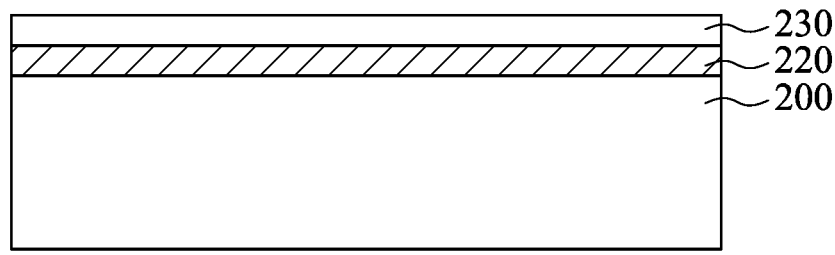

In S202 of FIG. 5, a passivation layer 230 is optionally formed over the BP layer 220, as shown in FIG. 6B. The passivation layer 230 is an interfacial layer that can facilitate desired bonding of a gate dielectric material with the 2D channel material. In some embodiments, the passivation layer 230 can be deposited using the ALD or CVD processes. In some embodiments, the passivation layer 230 is a two-dimensional (2D) insulator such as hexagonal boron nitride (h-BN, e.g., hexagonal BN). Boron nitride is a wide band gap III-V compound with remarkable physical properties and chemical stability. Hexagonal BN (h-BN) includes alternating boron and nitrogen atoms in a honeycomb arrangement, including sp2-bonded two-dimensional (2D) layers. Each layer of hexagonal BN includes boron and nitrogen atoms that are bound by strong covalent bonds, whereas the layers are held together by weak van der Waals forces, as in graphite. Accordingly, h-BN films can be peeled off from bulk BN crystals by micromechanical cleavage and used as a dielectric layer. Few-layer hexagonal BN can also be made by ultrasonication and high-energy electron beam irradiation of BN particles.

Figure 6C:
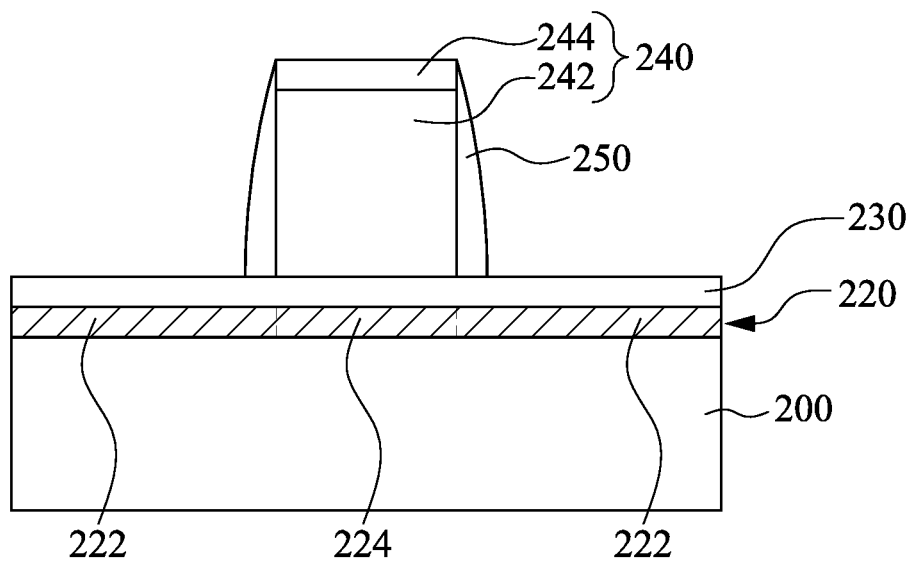

In S203 of FIG. 5, a gate stack 240 is formed over the passivation layer 230, as shown in FIG. 6C. In illustrated embodiments, the gate stack 240 is a dummy gate stack and will be replaced by a final gate stack. In other embodiments, the gate stack 240 is the final gate and will not be replaced. In some embodiments, the dummy gate stack 240 includes a dummy electrode layer 242 over the passivation layer 230 and a hard mask layer 244 over the dummy electrode layer 242. The dummy electrode layer 242 may comprise polycrystalline silicon (poly-Si) and may be formed by suitable deposition processes such as low-pressure chemical vapor deposition (LPCVD) and plasma-enhanced CVD (PECVD). The thickness of the dummy gate electrode 242 may range from 10 nm to 100 nm, as examples. An optional dummy gate dielectric layer (e.g., a layer of silicon oxide) may be deposited on the passivation layer 230 prior to the deposition of the dummy gate electrode 242. The hard mask layer 244 may include one or more layers of material such as silicon oxide and/or silicon nitride and is formed by deposition processes. In some embodiments, after the layers of materials are deposited over the passivation layer 230, one or more lithography and etching processes are performed to form the dummy gate stack 240. Gate spacers 250 are optionally formed adjacent to opposite sidewalls of the dummy gate stack 240. The gate spacers 250 may be formed by chemical vapor deposition of $Si_3N_4$ followed by reactive ion etching, in some embodiments. In some embodiments, a region of the BP layer 220 vertically overlapping the dummy gate electrode 242 can be referred to as a channel region 224, and regions of the BP layer 220 not vertically overlapping the dummy gate electrode 242 can be referred to as source/drain regions 222.

Figure 6D:
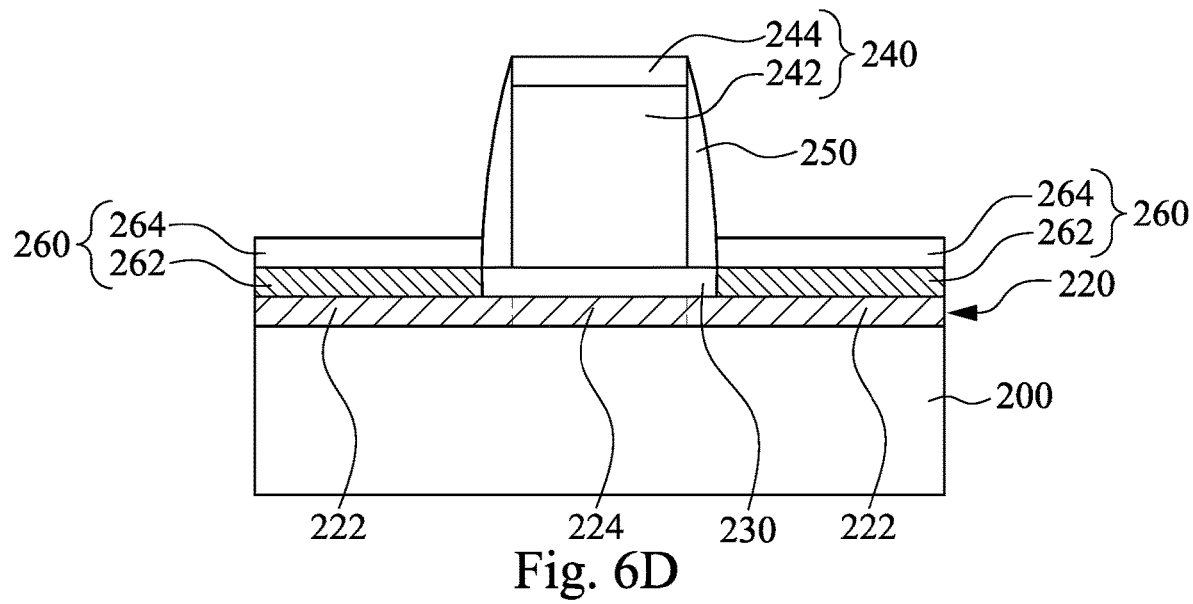

In S204 of FIG. 5, portions of the passivation layer 230 over the respective source/drain regions 222 of the BP layer 220 are removed to expose the source/drain regions 222, and stacked structures 260 are then formed over the exposed source/drain regions 222. The resulting structure is shown in FIG. 6D. The stacked structures 260 include dopant source layers 262 and cap metal layers 264 stacked over the respective dopant source layers 262. In one or more implementations, example materials that can be used for the dopant source layers 262 include elements of Group III, IV or VI, as discussed previously with regard to FIG. 2B. In some embodiments, example materials that can be used for the cap metal layers 264 include noble metals as discussed previously with regard to FIG. 2B. In some implementations, formation of the stacked structures 260 includes forming a blanket dopant source layer over the BP layer 220 and the dummy gate stack 240 and a blanket cap metal layer over the blanket dopant source layer, and then patterning these layers to remove portions of these layers over the dummy gate stack 240 and the gate spacers 250. In the illustrated embodiments, the dopant source layer 262 is germanium, and the cap metal layer 264 is gold.

Figure 6E:
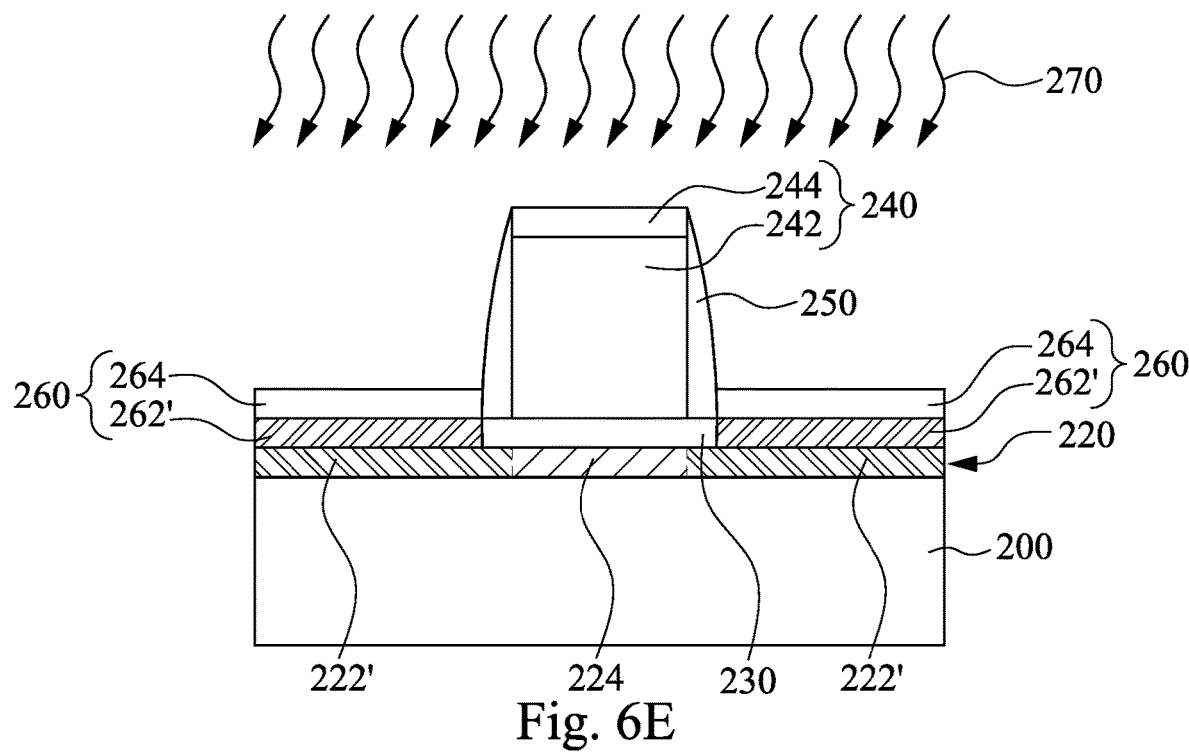

In S205 of FIG. 5, an anneal process 270 is carried out to drive dopants from the dopant source layers 262 to diffuse into the underlying source/drain regions 222 of the BP layer 220 to form phosphide-containing source/drain regions 222', as shown in FIG. 6E. The source/drain regions 222' can be equivalently referred to as phosphide-containing structures in some embodiments. Moreover, dopant source layers 262' after the anneal process 270 have lower dopant concentration than the dopant source layers 262. In some embodiments where the dopant source layers 262 are germanium, with increased anneal temperature, the germanium atoms diffuse from the dopant source layers 262 into the underlying source/drain regions 222 of the BP layer 220 and react with black phosphorus. This reaction results in formation of germanium-phosphide ($PGe_x$) compound. In this case, the germanium atoms may replace some phosphorus atoms in a crystal lattice structure of the BP layer 220 (e.g. a honeycomb lattice structure). Therefore, germanium atoms can be incorporated into the honeycomb lattice structure substitutionally to form the germanium-phosphide compound, and hence the source/drain regions 222' can also be referred to as substitutionally doped BP regions 222'. Further, the resulting dopant source layers 262' have lower germanium concentration (i.e. germanium atomic percentage) than the dopant source layer layers 262 because some germanium atoms are incorporated into the substitutionally doped BP regions 222'.

The anneal process 270 allows the phosphide-containing source/drain regions 222' to become metallic as discussed previously with regard to FIG. 2C. Process conditions of the anneal process 270 is controlled such that a majority of the channel region 224 is not intentionally doped by germanium and thus remains intrinsic black phosphorus. Therefore, the phosphide-containing source/drain regions 222' are more metallic than the BP channel region 224. Such a combination of the metallized BP regions 222' and the intrinsically semiconductive BP region 224 in the BP layer 220 is advantageous for reduction of source/drain contact resistance, as discussed previously. In some embodiments, the channel region 224 not intentionally doped can be equivalently referred to a phosphorene-containing structure. Moreover, the anneal process 270 eliminates the Van Der Waals gap or tunnel barrier between the dopant source layer 262 and the source/drain region 222, thereby leading to reduction of the source/drain contact resistance as well.

In some embodiments, the anneal process 270 is a rapid thermal anneal (RTA) process, or other suitable anneal process. In some embodiments, the RTA process is performed at a temperature in a range between about 200 degrees Celsius to about 300 degrees Celsius with a duration that lasts for about 5 seconds to 120 seconds in a nitrogen environment. For example, in the RTA process, the device as illustrated in FIG. 6D can be loaded in to an $N_2$ chamber and then heated to about 250 degrees Celsius in about 13 seconds, and the temperature is kept at about 250 degrees Celsius for about 60 seconds. The above-mentioned conditions is beneficial in creating germanium-phosphide in the source/drain regions 222' under the stacked structures 260 while leaving intrinsic black phosphorus in the channel region 224.

Figure 6F:
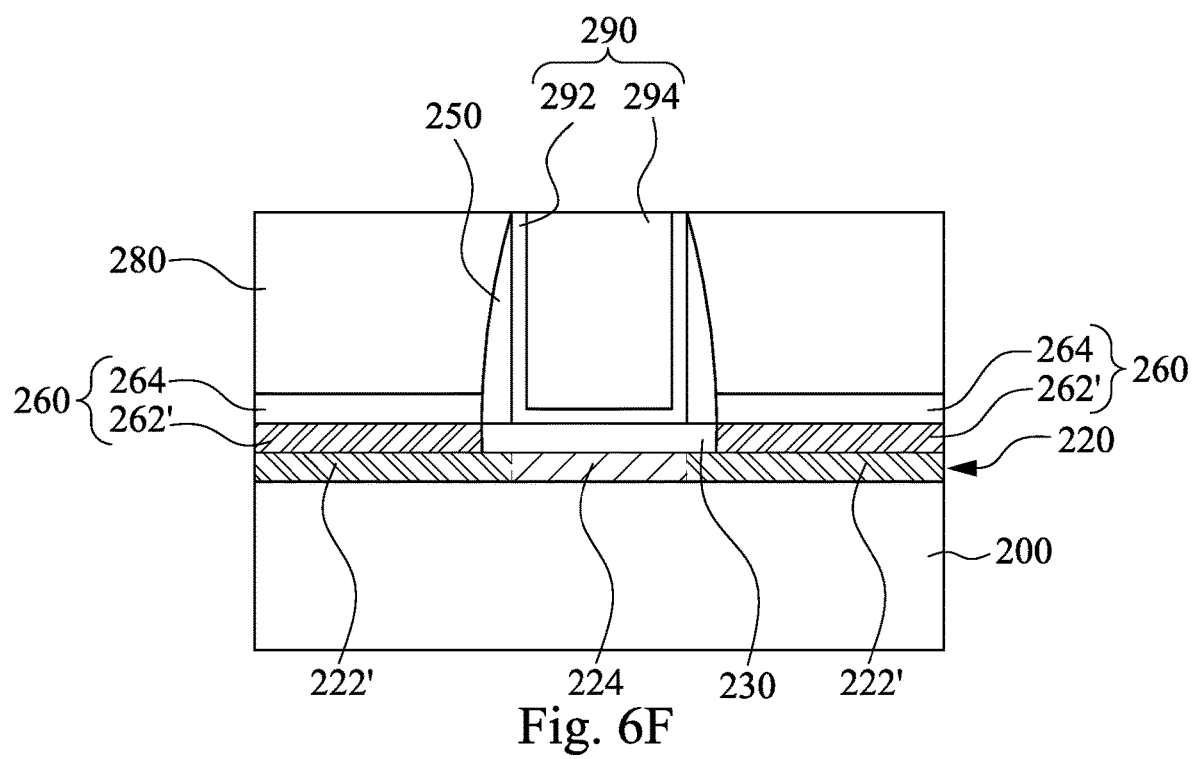

In S206 of FIG. 5, an interlayer dielectric (ILD) layer 280 can be formed over the stacked structures 260 and around the dummy gate stack 240, and the dummy gate stack 240 is then replaced by a gate stack 290 using a replacement gate process. The resulting structure is shown in FIG. 6F. In some embodiments, the ILD layer 280 may include materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 280 may be deposited by a PECVD process or other suitable deposition technique. In some embodiments, the ILD layer 280 is formed by a flow able CVD (FCVD) process. The FCVD process includes depositing a flowable material (such as a liquid compound) over the substrate 200 to fill various trenches, and converting the flowable material to a solid material by a suitable technique, such as thermal annealing or ultra-violet radiation. The ILD layer 280 is then etched back or planarized by a chemical mechanical planarization (CMP) process. In some embodiments, a contact etch stop layer (CESL) may be formed underneath the ILD layer 280. The CESL may include silicon nitride, silicon oxynitride, silicon nitride with oxygen (O) or carbon (C) elements, and/or other materials.

Exemplary methods of the replacement gate process include removing the dummy gate stack 240 to form a gate trench between the gate spacers 250 using suitable lithography and etching process, blanket forming a gate dielectric layer 292 over the substrate 200 and into the gate trench, forming a metal gate electrode 294 over the substrate 200 and filling the gate trench, and performing a CMP process to remove excessive materials of the metal gate electrode 294 and the gate dielectric layer 292 outside the gate trench.

In some embodiments, the gate dielectric layer 292 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 292 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

In some embodiments, the metal gate electrode 294 includes metals such as titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), other suitable materials, nitride (TiN), tungsten nitride (WN), tungsten (W), ruthenium (Ru), palladium (Pd), platinum (Pt), cobalt (Co), nickel (Ni), conductive metal oxides, and/or other suitable metals.

Figure 6G:
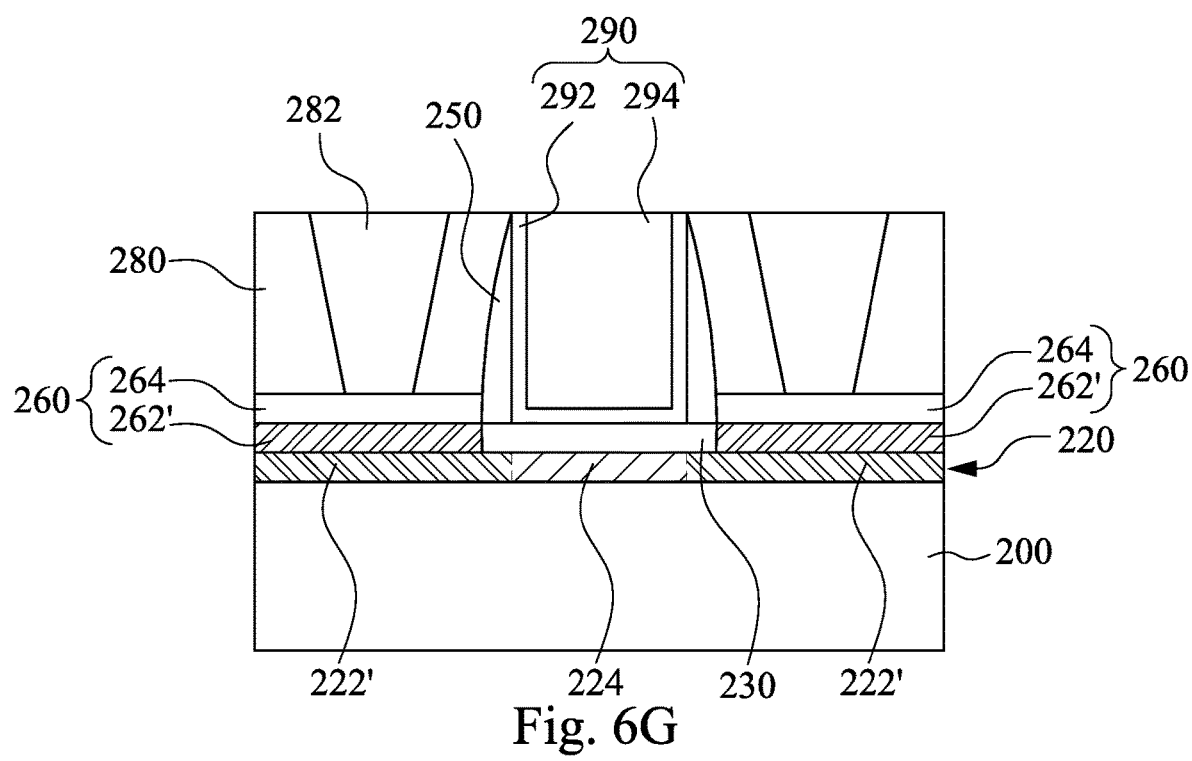

In S207 of FIG. 5, source/drain contacts 282 are formed in the ILD layer 280, as shown in FIG. 6G. For example, contact holes are etched in the ILD layer 280 until reaching the stacked structures 260, using one or more photolithography and etching processes, and are filled by conductive materials to serve as source/drain contacts. For example, the photolithography process forms a hard mask and the ILD layer 280 is then etched through the hard mask. The etching process may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethyl-ammonium hydroxide), other suitable wet etching solutions, or combinations thereof. The etching process stops at the cap metal layers 264.

After formation of the contact holes in the ILD layer 280, source/drain contacts 282 are formed in respective contact holes. In one or more implementations, example metals that can be used for the source/drain contacts 282 include Al, Cu, W, Ti, Ta, TiN, TiAl, TiAlN, TaN, NiSi, CoSi, and other conductive materials, or combinations thereof. In some implementations, the source/drain contacts 282 can be deposited using, for example, ALD, CVD, PVD, or other suitable deposition techniques. After the deposition of the source/drain contacts 282, a CMP process is performed to planarize the source/drain contacts 282 with a top surface of the ILD layer 280. As illustrated in FIG. 6G, the source/drain contacts 282 are in contact with respective cap metal layers 262 rather than intrinsic black phosphorus. As a result, the source/drain contact resistance can be reduced.

Figure 7:
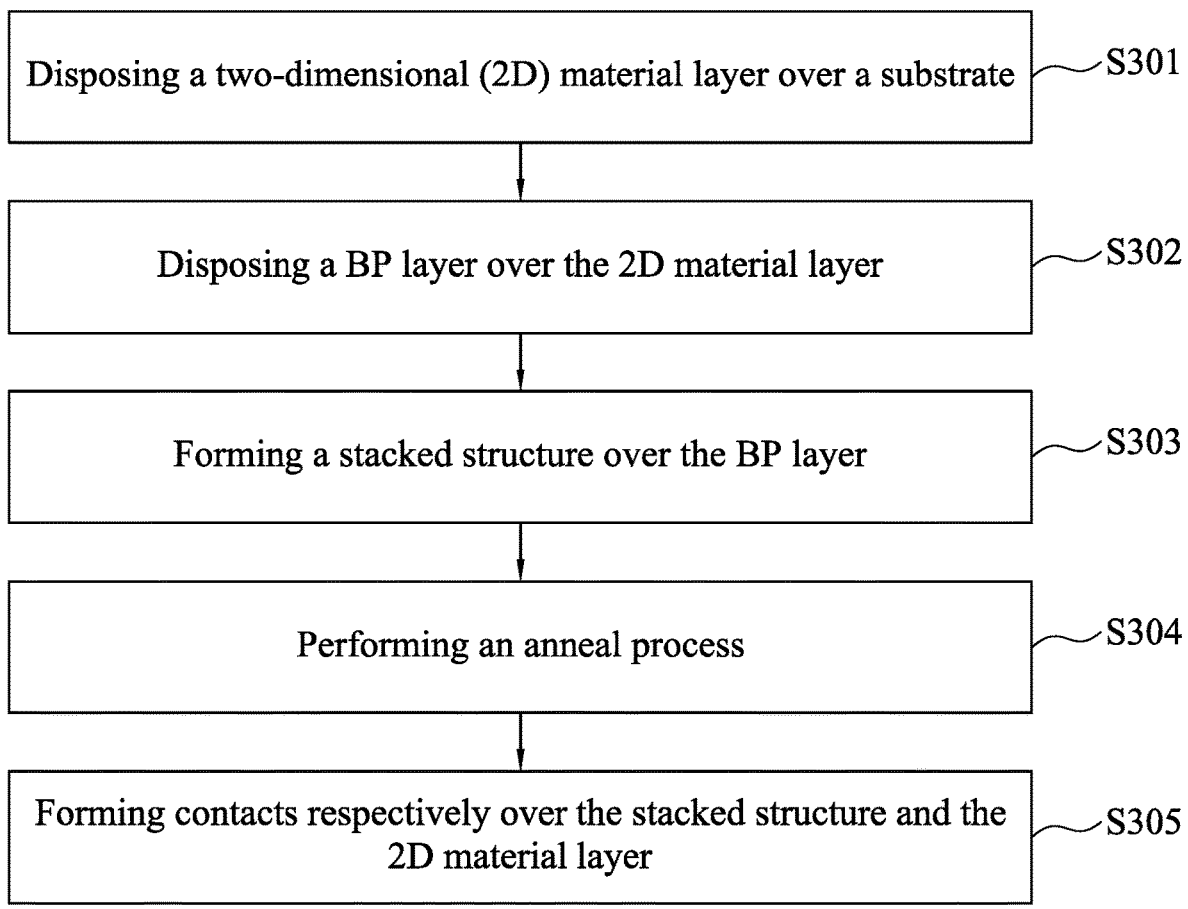
FIG. 7 is an exemplary process flow chart for fabrication of a semiconductor device such as a diode, according to some embodiments of the present disclosure.

FIG. 7 is an exemplary process flow chart for fabrication of a semiconductor device such as a diode, according to one or more embodiments of the present disclosure. The flow chart illustrates a relevant part of the entire manufacturing process. It is understood that additional operations may be provided before, during, and after the operations shown by FIG. 7, and some of the operations described below can be replaced or eliminated for additional embodiments of the method. The order of the operations/processes may be interchangeable.

Figure 8A:
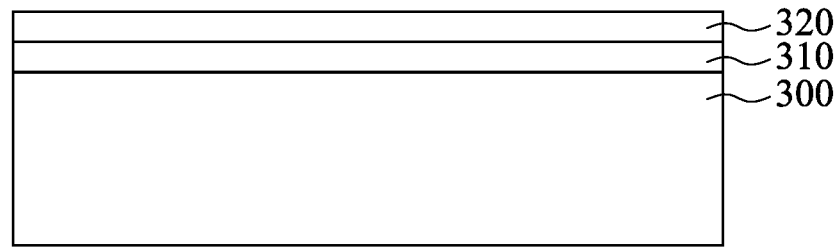
FIGS. 8A through 8E are exemplary cross-sectional views showing various processes for fabrication of a semiconductor device according to some embodiments of the present disclosure.

In S301 of FIG. 7, a 2D material layer 320 is disposed on a dielectric layer 310 over a substrate 300, as shown in FIG. 8A. The substrate 300 can be, for example, a p-type or n-type silicon substrate with suitable impurity concentration. The crystal orientation of Si substrate is (100) in some embodiments. Alternatively, the substrate 300 may comprise another elementary semiconductor, such as germanium, a compound semiconductor including Group IV-IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate 300 is a silicon layer of an SOI (silicon-on-insulator) substrate. Amorphous substrates, such as amorphous Si or amorphous SiC, or insulating material, such as silicon oxide, may also be used as the substrate 300. The substrate 300 may include various regions that have been suitably doped with impurities (e.g., p-type or n-type conductivity).

The 2D material layer 320 is formed from a 2D material such as transition metal dichalcogenides (TMDs). TMD materials include a class of materials that have the general chemical formula of $MX_2$, wherein M is a transition metal element, and X is a chalcogen. The exemplary materials of the transition metal M include Ti, V, Co, Ni, Zr, Mo, Tc, Rh, Pd, Hf, Ta, W, Re, Ir, and Pt. Element X may be S, Se, or Te. Exemplary TMD materials include $MoS_2$, $MoSe_2$, $WS_2$, $WSe_2$, $MoTe_2$, and $WTe_2$ in accordance with some exemplary embodiments. TMDs form a layered structure with the form X-M-X, wherein the chalcogen atoms X are distributed in two hexagonal planes separated by a plane of metal atoms M. In some embodiments, the 2D material layer 320 includes an n-type 2D material or a p-type 2D material. The conductive type of the 2D material layer 320 can be determined by the dopant (e.g. n-type dopant or p-type dopant) doped in the 2D material layer 320.

In some embodiments, the 2D material layer 320 is exfoliated from a bulk material using a physical method (mechanical exfoliation and tapping method). In some embodiments, the 2D material layer 320 is exfoliated from a bulk material using a chemical method (liquid exfoliation). In other embodiments, the 2D material layer 320 is formed over the dielectric layer 310 using suitable deposition techniques, such as ALD.

Figure 8B:
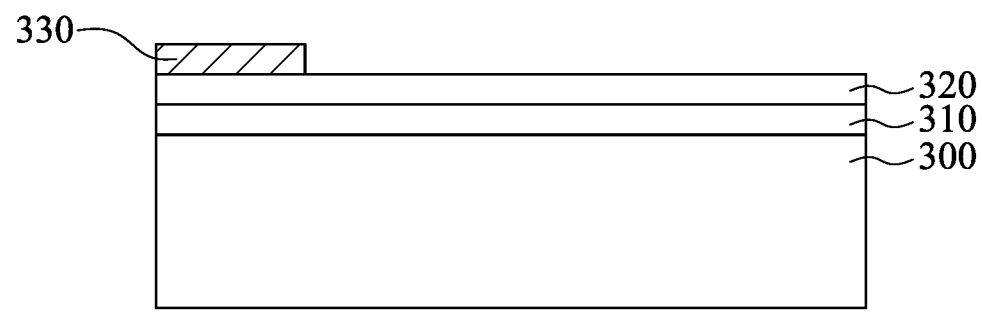

In S302 of FIG. 7, a BP layer 330 is disposed over the 2D material layer 320, as shown in FIG. 8B. The BP layer 330 is exfoliated from bulk black phosphorus crystals using a physical method (mechanical exfoliation and tapping method) in some embodiments. In other embodiments, the BP layer 330 is exfoliated from black phosphorus crystals using a chemical method (liquid exfoliation). In other embodiments, the BP layer 330 is formed over the 2D material layer 320 using suitable deposition techniques, such as atomic layer deposition (ALD), as described above.

Figure 8C:
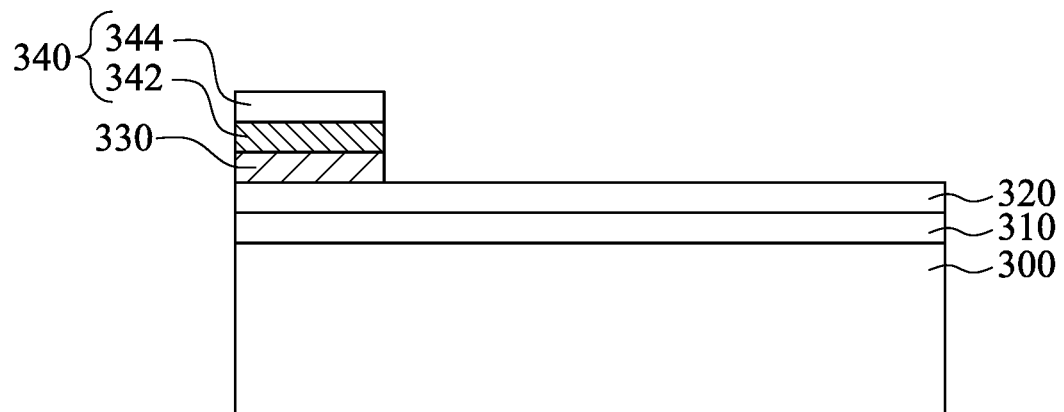

In S303 of FIG. 7, a stacked structure 340 is formed over the BP layer 330 using suitable deposition and lithography techniques. The resulting structure is shown in FIG. 8C. The stacked structure 340 includes a dopant source layer 342 and a cap metal layers 344 stacked over the dopant source layer 342. In one or more implementations, example materials that can be used for the dopant source layer 342 include elements of Group III, IV or VI, as discussed previously with regard to FIG. 2B. In some embodiments, example materials that can be used for the cap metal layer 344 include noble metals as discussed previously with regard to FIG. 2B. In the illustrated embodiments, the dopant source layer 342 is germanium, and the cap metal layer 344 is gold. Because germanium is an element of Group IV, it acts as a p-type dopant for the BP layer 330.

Figure 8D:
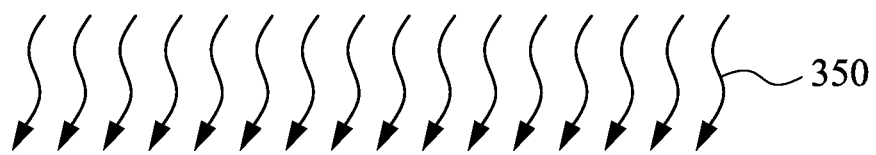
Figure 8D:
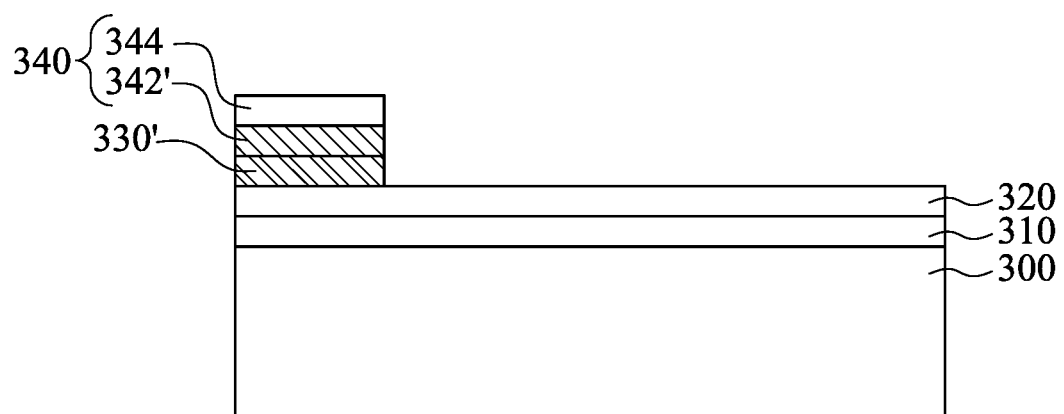

In S304 of FIG. 7, and anneal process 350 is carried out to drive the dopants from the dopant source layer 342 to diffuse into the underlying BP layer 330 to form a 2D phosphide-containing layer 330', as shown in FIG. 8D. Moreover, dopant source layer 342' after the anneal process 350 has lower dopant concentration than the dopant source layer 342. In some embodiments where the dopant source layer 342 are germanium, with increased anneal temperature, the germanium atoms diffuse from the dopant source layer 342 into the underlying BP layer 330 and react with black phosphorus. This reaction results in formation of germanium-phosphide ($PGe_x$) compound. In this case, the germanium atoms may replace some phosphorus atoms in a crystal lattice structure of the BP layer 330 (e.g. a honeycomb lattice structure). Therefore, germanium atoms can be incorporated into the honeycomb lattice structure substitutionally to form the germanium-phosphide compound, and hence the 2D phosphide-containing layer 330' can also be referred to as a substitutionally doped BP layer 330'. Further, the resulting dopant source layer 342' has lower germanium concentration (i.e. germanium atomic percentage) than the dopant source layer 342 because some germanium atoms are incorporated into the substitutionally doped BP layer 330'.

The anneal process 350 allows the 2D phosphide-containing layer 330' to become metallic as discussed previously with regard to FIG. 2C. The anneal process 350 eliminates the Van Der Waals gap or tunnel barrier between the dopant source layer 342 and the BP layer 330, thereby leading to reduction of the source/drain contact resistance. In some embodiments where the BP layer 330 is doped with a p-type dopant, such as germanium, the 2D material layer 320 can be formed from an n-type 2D material, such as n-type $MoS_2$. Stated another way, the dopant in the BP layer 330 and the dopant in the 2D material layer 320 are of opposite types of conductivity. As a result, a p-n junction is formed by the 2D phosphide-containing layer 330' and the 2D material layer 320, and a diode is therefore fabricated.

In some embodiments, the anneal process 350 is a rapid thermal anneal (RTA) process, or other suitable anneal process. In some embodiments, the RTA process is performed at a temperature in a range between about 200 degrees Celsius to about 300 degrees Celsius with a duration that lasts for about 5 seconds to 120 seconds in a nitrogen environment. For example, in the RTA process, the device as illustrated in FIG. 8C can be loaded in to an $N_2$ chamber and then heated to about 250 degrees Celsius in about 13 seconds, and the temperature is kept at about 250 degrees Celsius for about 60 seconds. The above-mentioned conditions may be beneficial in creating germanium-phosphide.

Figure 8E:
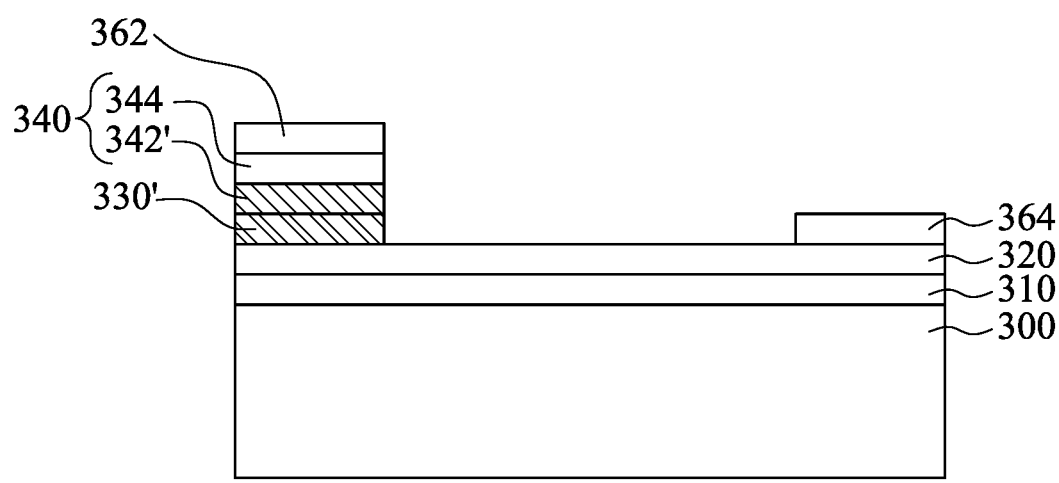

In S305 of FIG. 7, contacts 362 and 364 are respectively formed over the cap metal layer 344 and the 2D material layer 320, as shown in FIG. 8E. In one or more implementations, example metals that can be used for the contacts 362 and 364 include Al, Cu, W, Ti, Ta, TiN, TiAl, TiAlN, TaN, NiSi, CoSi, and other conductive materials, or combinations thereof. In some implementations, the contacts 362 and 364 can be deposited using, for example, ALD, CVD, PVD, or other suitable deposition techniques. As illustrated in FIG. 8E, the contact 362 is in contact with a cap metal layer 344 rather than intrinsic black phosphorus. As a result, the contact resistance can be reduced. In depicted embodiments, no stacked structure 340 is interposed between the contact 364 and the 2D material layer 320. In other embodiments, the operation in FIG. 8C also forms a stacked structure 340 over a region of the 2D material layer 320 separated from the BP layer 330, and the contact 364 is then formed the stacked structure 340.

The back-gated transistor, the top-gated transistor and the diode as discussed above are some examples for describing the doping process of the BP layer. The process concepts described above can also be integrated into fabrication processes for other semiconductor devices, such as FinFETs, gate-all-around (GAA) FETs, and can be implemented in a number of technology nodes, such as 10, 7, 5, 3 nm technology nodes. Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that an improved carrier concentration can be achieved by doping the BP layer. Another advantage is that the source/drain contact resistance can be reduced by doping the BP layer.

In some embodiments, a device includes a phosphide-containing structure, a dopant source layer and a conductive contact. The phosphide-containing structure has a first chemical element in a compound with phosphorus. The dopant source layer is over the phosphide-containing structure and has a second chemical element the same as the first chemical element. The conductive contact is over the dopant source layer.

In some embodiments, a device includes a channel region, source/drain regions, and a gate. The channel region formed of black phosphorous. The source/drain regions laterally extend from opposite sides of the channel region, respectively. The source/drain regions are formed of a compound of phosphorous and an element of Group III, IV or VI, and the channel region is free from the element of Group III, IV or VI. The gate overlaps with the channel region.

In some embodiments, a device includes a semiconductor layer, a doped black phosphorous layer, a first metal contact and a second metal contact. The semiconductor layer is of a first conductivity type. The doped black phosphorous layer is over a first region of the semiconductor layer. The doped black phosphorous layer is of a second conductivity type opposite the first conductivity type and forms a p-n junction with the first region of the semiconductor layer. The first metal contact is over the doped black phosphorous layer. The second metal contact is over a second region of the semiconductor layer laterally spaced apart from the first region of the semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a phosphide-containing structure made of a chemical compound of a first chemical element and phosphorus, wherein the chemical compound in the phosphide-containing structure has a resistance decreasing as temperature decreases;
a dopant source layer over the phosphide-containing structure and having a second chemical element the same as the first chemical element, wherein both the first chemical element and the second chemical element are an element of Group III, an element of Group IV or an element of Group VI; and
a conductive contact over the dopant source layer.

2. The device of claim 1, further comprising:
a phosphorene-containing structure laterally adjoining the phosphide-containing structure and free from coverage by the dopant source layer.

3. The device of claim 2, further comprising:
a dielectric layer below the phosphorene-containing structure; and
a back gate below the dielectric layer.

4. The device of claim 2, further comprising:
a passivation layer over the phosphorene-containing structure; and
a gate stack over the phosphorene-containing structure.

5. The device of claim 4, wherein the passivation layer is a two-dimensional insulator layer in contact with the phosphorene-containing structure.

6. The device of claim 4, wherein the passivation layer is formed of hexagonal boron nitride.

7. The device of claim 4, wherein the passivation layer laterally adjoins the dopant source layer.

8. The device of claim 4, further comprising:
a pair of gate spacers over the passivation layer and on opposite sides of the gate stack, respectively.

9. The device of claim 8, further comprising:
a pair of noble metal layers laterally extending from the pair of gate spacers, respectively.

10. The device of claim 1, further comprising:
a cap layer between the dopant source layer and the conductive contact, wherein the cap layer comprises a noble metal.

11. The device of claim 1, wherein both the first chemical element and the second chemical element are germanium.

12. The device of claim 1, further comprising:
a silicon oxide layer below the phosphide-containing structure.

13. A device, comprising:
a channel region formed of black phosphorous;
source/drain regions laterally extending from opposite sides of the channel region, respectively, wherein the source/drain regions are formed of a compound of phosphorous and an element of Group III, IV or VI, and the channel region is free from the element of Group III, IV or VI, wherein the compound of phosphorous and the element of Group III, IV or VI in the source/drain regions has a resistance in positive correlation with temperature; and
a gate overlapping with the channel region.

14. The device of claim 13, further comprising:
a two-dimensional insulator layer between the channel region and the gate.

15. The device of claim 14, wherein the two-dimensional insulator layer laterally extends past opposite sides of the gate.

16. The device of claim 13, wherein the source/drain regions are more metallic than the channel region.

17. A device, comprising:
a semiconductor layer of a first conductivity type;
a doped black phosphorous layer over a first region of the semiconductor layer, wherein the doped black phosphorous layer is of a second conductivity type opposite the first conductivity type and forms a p-n junction with the first region of the semiconductor layer;
a first metal contact over the doped black phosphorous layer; and
a second metal contact over a second region of the semiconductor layer laterally spaced apart from the first region of the semiconductor layer.

18. The device of claim 17, wherein the semiconductor layer is formed of a doped two-dimensional material.

19. The device of claim 17, wherein the semiconductor layer is formed of transition metal dichalcogenide.

20. The device of claim 17, further comprising:
a dopant source layer between the first metal contact and the doped black phosphorous layer, wherein the dopant source layer has a chemical element same as that in the doped black phosphorous layer.

* * * * *